United States Patent [19]

Shida et al.

[11] Patent Number: 4,675,471

[45] Date of Patent: Jun. 23, 1987

[54] ELECTRICAL CABLES

[75] Inventors: Mitsuzo Shida, Barrington; John Machonis, Jr., Schaumburg; Robert J. Zeitlin, Palatine, all of Ill.

[73] Assignee: Norchem, Inc., Rolling Meadows, Ill.

[21] Appl. No.: 635,661

[22] Filed: Jul. 30, 1984

[51] Int. Cl.[4] ....................... H01B 7/22; H01B 11/06; H01B 11/08; H05K 9/00

[52] U.S. Cl. ....................................... 174/36; 156/53; 174/107; 428/354; 428/355; 428/428; 428/475.1; 428/476.1; 428/476.3; 428/476.9; 428/483

[58] Field of Search .................. 174/36, 107; 428/354, 428/355, 428, 475.1, 476.1, 476.3, 476.9, 483; 156/53

[56] References Cited

U.S. PATENT DOCUMENTS

| | | | |
|---|---|---|---|
| 3,803,340 | 4/1974 | Jachimowicz et al. | 174/107 |
| 3,911,200 | 10/1975 | Simons et al. | 174/36 |
| 4,049,904 | 9/1977 | Hori et al. | 174/107 |
| 4,085,284 | 4/1978 | Oiszewski et al. | 174/36 |
| 4,087,587 | 5/1978 | Shida et al. | 428/500 |
| 4,088,588 | 5/1978 | Shida et al. | 428/500 |
| 4,092,452 | 5/1978 | Hori et al. | 428/215 |
| 4,125,739 | 11/1978 | Bow | 174/107 |
| 4,132,857 | 1/1979 | Scarola et al. | 174/107 |
| 4,165,442 | 8/1979 | Gabriel et al. | 174/36 |
| 4,230,830 | 10/1980 | Tanny et al. | 525/222 |
| 4,298,712 | 11/1981 | Machonis et al. | 525/74 |
| 4,323,721 | 4/1982 | Kincaid et al. | 174/36 |
| 4,327,248 | 4/1982 | Campbell | 174/107 |
| 4,449,014 | 5/1984 | Brezinsky | 174/107 |
| 4,452,942 | 6/1984 | Shida et al. | 525/74 |
| 4,453,031 | 6/1984 | Justiss | 174/36 |
| 4,460,745 | 7/1984 | Adur et al. | 525/74 |
| 4,487,885 | 12/1984 | Adur et al. | 525/74 |

FOREIGN PATENT DOCUMENTS 1096453 2/1981 Canada .

*Primary Examiner*—James C. Cannon
*Attorney, Agent, or Firm*—Wood, Dalton, Phillips, Mason & Rowe

[57] ABSTRACT

An improved electrical cable construction is provided wherein the metallic screen is coated with a protective coating which comprises a layer of a polymer selected for its properties of high flexural modulus, high tensile strength and high melting point and an adhesive layer comprising a random, block or graft copolymer of an olefin and a polymerizable, ethylenically unsaturated carboxylic acid, acid anhydride or derivative. Optionally, the adhesive layer may comprise a blend of the copolymer and a polyolefin.

43 Claims, 1 Drawing Figure

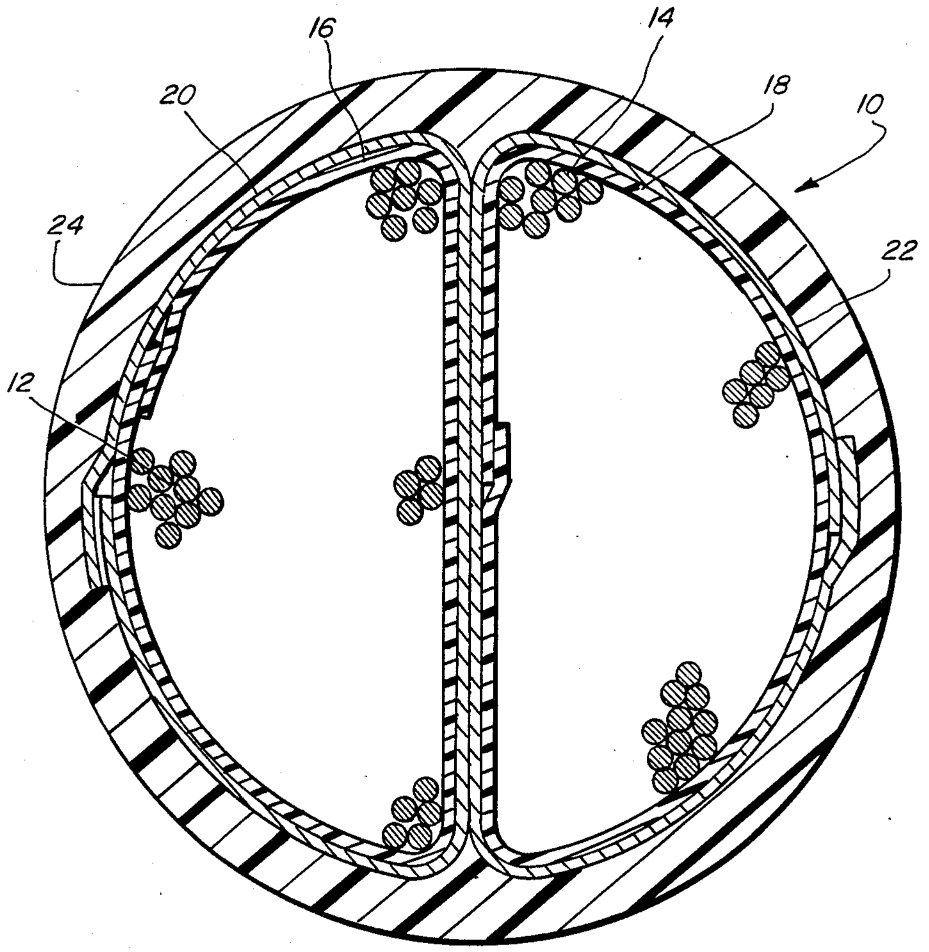
16
14
20
18
10
24
22
12

ELECTRICAL CABLES

BACKGROUND OF THE INVENTION

1. Field of the Invention

This invention relates to electrical cable constructions and, more particularly, this invention relates to improved communication cable constructions.

2. Description of the Prior Art

In the art of designing electrical cables, especially communication cables, conductors are generally assembled in a core which is surrounded by an outer shield (such as a sheath) and a jacket.

The shield is generally metallic, and the protective jacket is typically a polyolefin, such as polyethylene. In some cables, especially where the number of conductors in the core is very large or the cable very long, a screen, usually comprising a ribbon of metal such as aluminum, for example, extends through the multiconductor core. The screen is intended to prevent cross talk between cable pairs of the core, and can be in the shape of an S, Z, D, or T, or any other appropriate configuration.

Heretofore, the screen extended through the core has typically been prepared with a film of polypropylene or an oriented polyester resin laminated thereto. These constructions are stiff, resulting in buckling during the cable making operation, leading to an unusable cable.

In some cables, the cable core is filled with a cable filler material designed to prevent moisture from entering the cable. During the manufacture of the cable, the filler is heated to make it flowable. Such heating is accomplished by induction heating. If the screen becomes buckled or folded, the induction heating causes localized overheating in the screen, resulting in a temperature high enough to melt the polymeric coating of the screen, thus rendering the cable inoperative.

SUMMARY OF THE INVENTION

It is an object of the invention to overcome one or more of the problems described above.

According to the invention, a metallic screen is coated with a coextruded film comprising a layer of a polymer having selected properties of low flexural modulus, high tensile strength and high melting point, and a layer of adhesive.

The polymer layer is a polyamide, a copolyamide, or a copolyester. The adhesive is a copolymer of an olefin and at least one comonomer which is a polymerizable, ethylenically unsaturated carboxylic acid or acid anhydride or derivative thereof or, alternatively, the adhesive comprises an adhesive blend of the copolymer and a polyolefin.

The copolymer can be a random, block or graft copolymer.

Other objects and advantages of the invention will be apparent to those skilled in the art from the following detailed description taken in conjunction with the drawing and the appended claims.

BRIEF DESCRIPTION OF THE DRAWING

The sole FIGURE is a cross-sectional view of a communications cable illustrating one embodiment of the present invention.

DETAILED DESCRIPTION OF THE INVENTION

As stated above, the invention comprehends the provision of a metallic screen which extends through at least a portion of the conductive core of a cable, such as a communications cable. The metallic screen material is coated with a protective coextruded film of two layers. The first layer is a polyamide, copolyamide or copolyester polymer having properties of low flexural modulus, high tensile strength and high melting point selected to render the film resistant to buckling, thermal damage, or other mechanical damage.

Examples of such polymers useful in this invention are nylon 6, copolymers of nylon 6, such as nylon 6/12 for example, nylon 11, nylon 12 and copolyesters.

The second layer of the film is an adhesive which comprises a copolymer of an olefin and at least one polymerizable ethylenically unsaturated carboxylic acid, acid anhydride or other derivative. The adhesive layer may be a blend of the copolymer and a polyolefin, if desired. The copolymer is a block, random or graft copolymer.

The film has good interlayer adhesion, exhibits high bond strength when laminated to the metal of the screen, and has good electrical properties to prevent high voltage breakdown and electrical leaks. The screen of this invention has the high strength and low stiffness required for processing during cable manufacture, high temperature resistance to withstand the filling operation and good electrical properties required to prevent cross talk.

The FIGURE illustrates a telephone cable 10 which comprises an embodiment of the invention. The cable 10 comprises a plurality of conductors 12 for transmitting messages in one direction, and a second plurality of conductors 14 for transmitting signals in another direction. The illustrated groups of conductors 12 and 14 are each of generally semicircular cross-section, and the conductors of each group are bound together by plastic core wrap 16 and 18, respectively. Preferably, the core wraps 16 and 18 comprise a plastic tape.

Metal screens 20 and 22, respectively, are disposed outwardly of the core wraps 16 and 18, and are preferably corrugated and in contact with the core wraps 16 and 18.

The metal screens 20 and 22 serve the dual purpose of improving isolation between the opposite directions of transmission, as well as protecting against lightning and water. Both screens 20 and 22 may be of aluminum, or another metal, and may, if desired, be coated on both sides with a film of the invention, so as to adhere to each other along the portions thereof which extend across the diameter of the cable in contact with each other.

A plastic jacket 24 surrounds the shields 20, 22 about the entire circumferential surfaces thereof, and is adhered to the outside surfaces thereof by a suitable adhesive such as described in copending, commonly assigned U.S. patent application Ser. No. 521,041 filed Aug. 8, 1983.

The Shielding Material

The metallic screen of the present invention can be of any of a wide variety of metallic materials such as, for example, aluminum, aluminum alloys, alloy-clad aluminum, copper, surface modified copper, bronze, steel, tin-free steel, tin plate steel, aluminized steel, aluminum-clad steel, stainless steel, copper-clad stainless steel, copper-clad low carbon steel, terne-plate steel, galvanized steel, chrome plated or chrome treated steel, lead, magnesium, tin and the like. Such metals can, of course, be surface treated or have conversion coatings on the surface thereof if desired.

A particularly preferred metallic screen material is aluminum.

The Adhesive

The adhesive layer is a copolymer of an olefin such as ethylene, propylene, etc. and at least one comonomer which is an ethylenically unsaturated carboxylic acid, acid anhydride or derivative. The copolymer is a block, random or graft copolymer.

Optionally, the adhesive may be an adhesive blend of the copolymer and a polyolefin.

The Copolymer

The copolymers used in this invention are prepared by reacting unsaturated carboxylic acids or acid anhydrides, or derivatives thereof, with one or more olefins.

Carboxylic acids or anhydrides useful as comonomers include compounds such as maleic anhydride, itaconic acid anhydride, 4-methyl cyclohex-4-ene-1,2-dicarboxylic acid or anhydride, bicyclo(2.2.2)oct-5-ene-2,3-dicarboxylic acid or anhydride, 1,2,3,4,5,8,-9,10-octahydronaphthalene-2,3-dicarboxylic acid or anhydride, 2-oxa-1,3-diketospiro(4.4)non-7-ene, bicyclo(2.2.1)hept-5-ene-2,3-dicarboxylic acid or anhydride, tetrahydrophthalic acid or anhydride, x-methylbicyclo(2.2.1)hept-5-ene-2,3-dicarboxylic acid or anhydride, x-methylnorborn-5-ene-2,3-dicarboxylic acid or anhydride, norborn-5-ene-2,3-dicarboxylic acid or anhydride, Nadic ® anhydride, Nadic ® methyl anhydride, Himic ® anhydride, and methyl Himic ® anhydride.

Monomers which ring close to form anhydrides or imides when subjected to heat, e.g., maleic acid, fumaric acid, citric acid, citraconic acid and monoalkyl maleates and maleamic acids, may also be used in this invention.

Maleamic acids useful in this invention are substituted maleamic or fumaramic acids of the formulas:

$$R''O\overset{O}{\overset{\|}{C}}CH=CH\overset{O}{\overset{\|}{C}}NH-R'-\overset{O}{\overset{\|}{C}}OR''' \qquad (a)$$

where R' is a straight or branched alkylene radical of 1-18 carbon atoms, a cycloaliphatic or aromatic ring, and R'' and R''' are H or a straight or branched alkylene cycloaliphatic, heterocyclic or aromatic radical; and, $$(R''O\overset{O}{\overset{\|}{C}}CH=CH\overset{O}{\overset{\|}{C}}NH)_2R'_n \qquad (b)$$

where n is either zero or one and R'and R''are as described above.

Among the carboxylic acids and acid anhydrides particularly useful in the copolymers of this invention are maleic anhydride, fumaric acid, x-methylbicyclo(2.2.1)hept-5-ene-2,3-dicarboxylic acid anhydride and bicyclo(2.2.1)hept-5-ene-2,3-dicarboxylic acid anhydride.

Other monomers which modify the physical and chemical properties of the graft copolymers may be cografted to the copolymer backbone, in the case of graft copolymer.

For example, conjugated unsaturated esters and amides can be used as cograft monomers. Included among the conjugated unsaturated esters suitable for cografting are dialkyl maleates, dialkyl fumarates, dialkyl itaconates, dialkyl mesaconates, dialkyl citraconates, alkyl crotonates, alkyl tiglates where alkyl represent aliphatic, aryl-aliphatic and cycloaliphatic groups containing 1-12 carbon atoms. Esters particularly useful in the cografted copolymers of this invention are dibutyl maleate, diethyl fumarates and dimethyl itaconate.

It is often desirable to use more than one grafting monomer in either or both classes of monomers in order to control the physical properties of the final products.

In the case of graft copolymers, grafting is accomplished, in general, by heating a mixture of the polyolefin backbone material and the monomer or monomers with or without a solvent. The mixture can be heated to above the melting point of the polyolefin with or without a catalyst. Thus, the grafting occurs in the presence of air, hydroperoxides, or other free radical catalysts or, preferably, in the essential absence of those materials where the mixture is maintained at elevated temperatures and (if no solvent is used) preferably under high shear.

The term "polyethylene" used herein in reference to the graft copolymer backbone includes ethylene homopolymers, and copolymers of ethylene with propylene, butene and other unsaturated aliphatic hydrocarbons containing at least 50 mole percent ethylene. It is preferable sometimes to use mixtures of two or more of the above homopolymers or copolymers. Especially preferred for the grafting backbone are high density polyethylenes with a density of 0.94 to 0.96+ and ethylene/olefin copolymers with a density of 0.915 to 0.939 (known as linear low density polyethylene, LLDPE).

Additional Ingredients

If desired, the adhesive of the invention may additionally contain one or more elastomers. The term "elastomer" as used herein denotes homopolymers of isobutylene, copolymers of isobutylene, elastomeric copolymers of ethylene and 1-olefins, elastomeric terpolymers of ethylene, 1-olefins and a diene, homopolymers of chloroprene, copolymers of a diene and a vinyl aromatic compound, block copolymers of a diene vinyl aromatic compound, hydrogenated block copolymers of a diene and vinyl aromatic compound, homopolymers of butadiene, and copolymers of an ethylenically unsaturated nitrile and diene.

A number of adhesive blends which are believed to be useful in the invention are described in U.S. Pat. Nos. 4,087,587 (Shida et al), 4,087,588 (Shida et al), 4,298,712 (Machonis et al), 4,452,942 (Shida et al), 4,460,745 (Adur et al), and 4,487,885 (Adur et al), all assigned to the assignee hereof. Another patent which discloses blends which are believed to be useful in this invention is U.S. Pat. No. 4,230,830 (Tanny et al).

Other U.S. patents which disclose blends which are believed to be useful in the invention include U.S. Pat. Nos. 3,342,771 (Cheritat); 3,658,148 (McConnell); 3,856,889 (McConnell); 3,953,541 (Fuji); 4,058,647 (Inoue); 4,111,898 (Inayoshi et al); 4,134,927 (Tomoshize); 4,198,327 (Matsumoto et al); 4,198,369 (Yosikawa et al); 4,284,541 (Takeda et al); 4,350,740 (Coran et al); 4,350,797 (Marzola et al); and 4,370,388 (Mito).

The respective disclosures of the above-identified U.S. patents are hereby incorporated herein by reference.

EXAMPLES

The invention is illustrated by means of the following specific Examples. However, no unnecessary limitations are to be understood therefrom.

EXAMPLE 1

X-methyl bicyclo(2.2.1) hept-5-ene-2,3dicarboxylic anhydride (XMNA) was reacted with a high density polyethylene homopolymer whose melt index under high load is 3.0 g/10 minutes and whose density is 0.961 g/cc to give a graft copolymer containing 1.5 wt. % XMNA and a melt index of 1.5 g/10 minutes. This graft copolymer was blended with an ethylene vinyl acetate copolymer (EVA) containing 8 wt. % vinyl acetate and whose melt index is 3.0 at a ratio of 1.9:18.1. The resultant adhesive resin was coextruded with nylon 6/12 copolymer (Emser Industries Grilon CR-9).

The resulting coextruded film was tested for adhesion between nylon 6/12 and the adhesive blend of this Example. The coextruded film was laminated to aluminum through the adhesive resin in a heat sealer. The resulting lamination was tested for adhesion to aluminum. The results are shown in Table I.

EXAMPLE 2

An adhesive blend of the graft copolymer described in Example 1 and a linear low density polymer (LLDPE) having a melt index of 2 and a density of 0.919 in a ratio of 1:9 was prepared. The adhesive blend was coextruded with nylon 6/12. The adhesion of the coextruded film was tested. The coextruded film was laminated to aluminum through the adhesive resin. The results of the adhesion to nylon 6/12 and to aluminum are shown in Table I.

EXAMPLE 3

An adhesive blend of the graft copolymer described in Example 1 with a low density polyethylene (LDPE) whose density is 0.932 and whose melt index is 3.0, and a linear low density polymer (LLDPE) in the ratio 1:7:2 was prepared. The adhesive blend was coextruded with nylon 6/12. The adhesion of the coextruded film was tested. The coextruded film was laminated to aluminum through the adhesive resin. The results of adhesion to nylon 6/12 and to aluminum are shown in Table I.

EXAMPLE 4

An adhesive blend comprising the graft copolymer of Example 1 a LDPE of density 0.922, melt index of 1.8 and polybutene-1 whose density is 0.908 and whose melt index is 2 in the ratio of 1:8:1 was coextruded and tested according to Example 1 . The results are shown in Table I.

TABLE I

| | Adhesion to nylon lbs/in | Adhesion to Aluminum 475° at 1 sec |
|---|---|---|
| Example 1 | CNS | 2.8 |
| Example 2 | CNS | 3.3 |
| Example 3 | CNS | 7.2 |
| Example 4 | CNS | 7.2 |

CNS = could not separate

EXAMPLE 5

The adhesive blend of Example 1 was coextruded with a copolyester (Eastman Chemical Products, Inc. Kodar PETG Copolyester 6763). The adhesion of the blend of Example 1 to the polyester in the coextruded film was 0.9 lbs. per inch.

EXAMPLE 6

An adhesive blend of the graft copolymer described in Example 1 with a high density polyethylene (density=0.955 g/cc, melt index=18) and polyisobutylene in the ratio of 1:7:2 was prepared. The adhesive blend was coextruded with nylon 6. The adhesion of the coextruded film to aluminum was tested after heat sealing at 475° F. and 1 sec and found to be 11 lbs/in. The adhesion between the nylon 6 and the blend of this Example in the coextruded film was found to be inseparable.

EXAMPLE 7

The lower flexural moduli of several polymers useful in the invention are shown in Table II. This table compares with flexural modulus of copolymers useful in this invention with those presently used in the art. It can be seen that when the nylon 6, nylon 6/12, nylon 11 or nylon 12 is compared with polypropylene or a PET the flexural modulus is much lower than the polymers presently being used to coat screens. This is also true of the polyolefin resins used to prepare the adhesive blend required to adhere the coextruded coating to metal. One example, the LLDPE used in Example 2, is shown in Table II. Similarily the PETG has a much lower modulus than PET as shown in Table II.

Furthermore, the requirement of high tensile strength is met as shown in Table II where the values of tensile strength at break are given. The nylons are considerably higher than the polypropylene presently being used and are equivalent to PET. Similarily the LLDPE used as the blending resin for the adhesive blend in Example 2 has essentially the same tensile strength as polypropylene. Therefore, the requirements of low modulus and high tensile strength are met by the polymers of this invention.

TABLE II

Physical Properties of Resins Used to Prepare Screens

| Resin | Flexural Modulus ASTM D 790 @ 23° 50% R.H. P.S.I. | Tensile Strength @ Break ASTM D 6384 Dry PSI |
|---|---|---|
| Nylon 6 | 140,000[1] | 18,000 |
| Nylon 6/12 | 100,000[2] | 8,800 |
| Nylon 11 | 150,000[1] | 8,000 |
| Nylon 12 | 170,000[1] | 9,000 |
| Linear Low Density PE | 75,000[2] | 4,000 |
| Polypropylene | 250,000[2] | 4,500 |
| PETG | 290,000[3] | 4,000 |
| PET | 450,000[2] | 9,500 |

[1]"Nylon", M.I. Kohan (1973) John Wiley & Sons, pgs. 339 and 481.
[2]"Modern Plastics Encyclopedia" 1982-1983 Edition.
[3]Eastman Chemical Co. Publication #MB-806, June 1982.

The foregoing detailed description is given for clearness of understanding only, and no unnecessary limitations should be inferred therefrom as modifications within the scope of the invention will be obvious to those skilled in the art.

We claim:

1. An electrical cable comprising a conductive core and a metallic screen extending through at least a portion of said core, said screen including a protective coating adhered directly to the surface thereof, said coating comprising a coextruded film of:

(a) a layer of a polymer selected from the group consisting of polyamides, copolyamides and copolyesters and having properties of low flexural modulus, high tensile strength and high melting point selected to render the film resistant to buckling and thermal damage; and, (b) a layer of adhesive adhered directly to said screen surface and directly to said polymer layer of (a) and comprising (i) a copolymer of an olefin and at least one comonomer comprising a polymerizable, ethylenically unsaturated carboxylic acid or acid anhydride or derivative thereof, or (ii) a blend of said copolymer with a polyolefin, wherein said monomer is chosen from the group consisting of maleic acid or anhydride, itaconic acid or anhydride, 4-methyl cyclohex-4-ene-1,2-dicarboxylic acid or anhydride, bicyclo(2.2.2)oct-5-ene-2,3-dicarboxylic acid or anhydride, 1,2,3,4,5,8,9,10 octahydronaphthalene-2,3-dicarboxylic acid or anhydride, 2-oxa-1,3-diketos-piro(4.4) non-7-ene, bicyclo(2.2.1)hept-5-ene-2,3-dicarboxylic acid or anhydride, tetrahydrophthalic acid or anhydride, x-methylbicyclo(2.2.1)hept-5-ene 2,3-dicarboxylic acid or anhydride, x-methylnorborn-5-ene ene-2,3-dicarboxylic acid or anhydride, norborn-5-ene-2,3-dicarboxylic acid or anhydride, fumaric acid, citric acid, citraconic acid, monoalkyl maleates and maleamic acids.

2. The cable of claim 1 wherein said screen is of a metal chosen from the group consisting of chrome coated steel, chrome oxide coated steel, stainless steel, aluminum and copper.

3. The cable of claim 2 wherein said metal is aluminum.

4. The cable of claim 1 wherein said polymer of (a) is a polyamide or copolyamide selected from the group consisting of nylon 6, a copolymer of nylon 6, nylon 11 or nylon 12.

5. The cable of claim 4 wherein said copolyamide is nylon 6/12.

6. The cable of claim 1 wherein said polymer of (a) is a copolyester.

7. The screen of claim 1 wherein said copolymer of (b) is a block copolymer.

8. The screen of claim 1 wherein said copolymer of (b) is a random copolymer.

9. The cable of claim 1 wherein said copolymer of (b) is a graft copolymer of an ethylene homopolymer or copolymer backbone and said comonomer is a grafting monomer.

10. The cable of claim 9 wherein said backbone comprises at least one ethylene homopolymer or copolymer of ethylene with an unsaturated aliphatic hydrocarbon.

11. The cable of claim 10 wherein said backbone comprises linear low density polyethylene or, alternatively, an ethylene homopolymer having a density of about 0.94 to 0.96 g/cc.

12. The cable of claim 1 wherein said copolymer is a graft copolymer and is further grafted with a cograft monomer selected from the group consisting of dialkyl maleates, dialkyl fumarates, dialkyl itaconates, dialkyl mesaconates, dialkyl citraconates, alkyl acrylates, alkyl crotonates, alkyl tiglates, and alkyl methacrylates where alkyl is aliphatic, aryl-aliphatic or cycloaliphatic groups containing 1-12 carbon atoms.

13. The cable of claim 1 wherein said adhesive layer of (b) is an adhesive blend and said polyolefin of (b)(ii) is an ethylene homopolymer.

14. The cable of claim 13 wherein said ethylene homopolymer is high density polyethylene.

15. The cable of claim 1 wherein said adhesive layer of (b) is an adhesive blend and said polyolefin of (b)(ii) is a copolymer.

16. The cable of claim 15 wherein said copolymer is linear low density polyethylene.

17. The cable of claim 15 wherein said copolymer is an ethylene/ester copolymer selected from the group consisting of ethylene-vinyl acetate copolymers, ethylene-methyl acrylate copolymers, ethylene-ethyl acrylate copolymers, ethylene-methyl methacrylate copolymers and ethylene-ethyl methacrylate copolymers.

18. The cable of claim 1 wherein said adhesive layer of (b) is an adhesive blend and further includes one or more elastomers.

19. The cable of claim 18 wherein said elastomer is chosen from the group consisting of homopolymers of isobutylene, copolymers of isobutylene, elastomeric copolymers of ethylene and 1-olefins, elastomeric terpolymers of ethylene, 1-olefins and a diene, homopolymers of chloroprene, copolymers of a diene and a vinyl aromatic compound, block copolymers of a diene and a vinyl aromatic compound, hydrogenated block copolymers of a diene and a vinyl aromatic compound, homopolymers of butadiene, and copolymers of an ethylenically unsaturated nitrile and a diene.

20. The cable of claim 18 wherein said adhesive layer of (b) comprises a blend of a graft copolymer, a high density ethylene homopolymer or a copolymer of ethylene with a 1-olefin, and polyisobutylene.

21. The cable of claim 20 wherein said blend comprises a graft copolymer of a high density polyethylene backbone and x-methyl bicyclo(2.2.1)hept-5-ene-2,3-dicarboxylic acid or anhydride, a high density polyethylene homopolymer, and polyisobutylene.

22. The cable of claim 9 wherein said backbone of (b) is high density polyethylene or linear low density polyethylene and said grafting monomer is selected from the group consisting of maleic acid or anhydride, fumaric acid or anhydride, x-methyl bicyclo(2.2.1)hept-5-ene-2,3-dicarboxylic acid or anhydride, and bicyclo(2.2.1-)hept-5-ene-2,3-dicarboxylic acid or anhydride.

23. The cable of claim 1 wherein the flexural modulus of the polymer of (a) is less than about 200,000 psi.

24. The cable of claim 22 wherein the tensile strength of the polymer of (a) is greater than about 7000 psi.

25. An electrical cable comprising a conductive core and a metallic screen extending through at least a portion of said core, said screen including a protective coating adhered directly to the surface thereof, said coating comprising a coextruded film of:

(a) a layer of a polymer selected from the group consisting of polyamides, copolyamides and copolyesters and having properties of low flexural modulus, high tensile strength and high melting point selected to render the film resistant to buckling and thermal damage; and, (b) a layer of adhesive adhered directly to said screen surface and directly to said polymer layer of (a) and comprising (i) a graft copolymer of an olefin polymer backbone and at least one grafting monomer comprising a polymerizable, ethylenically unsaturated carboxylic acid or acid anhydride or derivative thereof, or (ii) a blend of said copolymer with a polyolefin, wherein said grafting monomer is chosen from the group consisting of maleic acid or anhydride, itaconic acid or anhydride, 4-methylcyclohex-4-ene-1,2-dicarboxylic acid or anhydride, bicyclo(2.2.2)oct-5-ene-2,3-dicarboxylic acid or anhydride, 1,2,3,4,5,8,9.10 octahydronaphthalene-2, 3-dicarboxylic acid or anhydride, 2-oxa-1,3-diketospiro(4.4)non-7-ene, bicyclo(2.2.1)hept-5-ene-2, acid or anhydride, tetrahydrophthalic acid or anhydride, x-methylbicyclo(2.2.1)hept-5-ene-2.3dicarboxylic acid or anhydride, x-methylnorborn-5-ene-2,3-dicarboxylic acid or anhydride, norborn-5-ene-2.3dicarboxylic acid or anhydride, fumaric acid, citric acid, citraconic acid, monoalkyl maleates and maleamic acids.

26. The cable of claim 25 wherein said screen is of a metal chosen from the group consisting of chrome coated steel, chrome oxide coated steel, stainless steel, aluminum and copper.

27. The cable of claim 26 wherein said metal is aluminum.

28. The cable of claim 25 wherein said polymer of (a) is a polyamide or copolyamide selected from the group consisting of nylon 6, a copolymer of nylon 6, nylon 11 or nylon 12.

29. The cable of claim 28 wherein said copolyamide is nylon 6/12.

30. The cable of claim 25 wherein said polymer of (a) is a copolyester.

31. The cable of claim 25 wherein said backbone comprises an ethylene homopolymer or copolymer.

32. The cable of claim 25 wherein said backbone is further grafted with a cograft monomer selected from the group consisting of dialkyl maleates, dialkyl fumarates, dialkyl itaconates, dialkyl mesaconates, dialkyl citraconates, alkyl acrylates, alkyl crotonates, alkyl tiglates, and alkyl methacrylates where alkyl is aliphatic, aryl-alphatic or cycloaliphatic groups containing 1-12 carbon atoms.

33. The cable of claim 25 wherein said adhesive layer of (b) is an adhesive blend and said polyolefin of (b) (ii) is an ethylene homopolymer.

34. The cable of claim 33 wherein said ethylene homopolymer is high density polyethylene.

35. The cable of claim 25 wherein said adhesive layer of (b) is an adhesive blend and said polyolefin of (b)(ii) is a copolymer.

36. The cable of claim 35 wherein said copolymer is linear low density polyethylene.

37. The cable of claim 35 wherein said copolymer is an ethylene/ester copolymer selected from the group consisting of ethylene-vinyl acetate copolymers, ethylene-methyl acrylate copolymers, ethylene-ethyl acrylate copolymers, ethylene-methyl methacrylate copolymers and ethylene-ethyl methacrylate copolymers.

38. The cable of claim 25 wherein said adhesive layer of (b) is an adhesive blend and further includes one or more elastomers.

39. The cable of claim 38 wherein said elastomer is chosen from the group consisting of homopolymers of isobutylene, copolymers of isobutylene, elastomeric copolymers of ethylene and 1-olefins, elastomeric terpolymers of ethylene, 1-olefins and a diene, homopolymers of chloroprene, copolymers of a diene and a vinyl aromatic compound, block copolymers of a diene and a vinyl aromatic compound, hydrogenated block copolymers of a diene and a vinyl aromatic compound, homopolymers of butadiene, and copolymers of an ethylenically unsaturated nitrile and a diene.

40. The cable of claim 38 wherein said adhesive layer of (b) comprises a blend of a graft copolymer, a high density ethylene homopolymer or a copolymer of ethylene with a 1olefin, and polyisobutylene.

41. The cable of claim 40 wherein said blend comprises a graft copolymer of a high density polyethylene backbone and x-methyl bicyclo(2.2.1)hept-5-ene-2,3-dicarboxylic acid or anhydride, a high density polyethylene homopolymer, and polyisobutylene.

42. The cable of claim 25 wherein the flexural modulus of the polymer of (a) is less than about 200,000 psi.

43. The cable of claim 41 wherein the tensile strength of the polymer of (a) is greater than about 7000 psi.

* * * * *